(12) United States Patent
Meunier-Beillard et al.

(10) Patent No.: US 7,615,390 B2
(45) Date of Patent: Nov. 10, 2009

(54) METHOD AND APPARATUS FOR FORMING EXPITAXIAL LAYERS

(75) Inventors: Philippe Meunier-Beillard, Eindhoven (NL); Mathieu Rosa Jozef Caymax, Leuven (BE)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 10/530,063

(22) PCT Filed: Aug. 13, 2003

(86) PCT No.: PCT/IB03/03635

§ 371 (c)(1),
(2), (4) Date: Mar. 31, 2005

(87) PCT Pub. No.: WO2004/031457

PCT Pub. Date: Apr. 15, 2004

(65) Prior Publication Data

US 2006/0040477 A1   Feb. 23, 2006

(30) Foreign Application Priority Data

Oct. 3, 2002   (EP)   .................................. 02079085

(51) Int. Cl.
*H01L 21/00* (2006.01)
(52) U.S. Cl. ........................... 438/41; 438/44; 438/222; 438/226; 438/413; 438/442; 257/E21.09; 257/E21.461
(58) Field of Classification Search .................. 438/41, 438/44, 222, 226, 413, 442; 257/E21.09, 257/E21.461
See application file for complete search history.

(56) References Cited

U.S. PATENT DOCUMENTS 5,119,540 A * 6/1992 Kong et al. .................. 118/730
5,155,062 A * 10/1992 Coleman ...................... 117/88
5,879,970 A * 3/1999 Shiota et al. ................. 438/151
2001/0015922 A1* 8/2001 Ponomarev .................. 365/200
2003/0036268 A1* 2/2003 Brabant et al. .............. 438/689

FOREIGN PATENT DOCUMENTS

WO   WO 01/14619   3/2001

OTHER PUBLICATIONS

Klumpp A et al: "Amporphous Silicon Carbide and its Application in Silicon Micromachining" Sensors and Actuators A, Elsevier Sequoisa S.A., Lausanne, CH, vol. A41, No. 1/3, Apr. 1, 1994.
Von Munch W et al: "New Susceptor Arrangement for the Epitaxial Growth of Beta-SiC on Silicon" Journal of Crystal Growth, North-Holland Publishing Co., Amsterdam, NL, vol. 158, No. 4, Feb. 1, 1996.
Nordell N et al: "Growth of SiC Using Hexamethyldisilane in a Hydrogen-Poor Ambient" Applied Physics Letters, American Inst. of Physics. New York, YS, vol. 64, No. 13, Mar. 28, 1994 pp. 1647-1649.
Kobayashi S et al: "Initial Growth Characteristics of Germanium on Silicon in LPCVD Using Germane Gas" Journal of Crystal Growth, North-Holland Publishing Co., Amsterdam, NL, NOL. 174, No. 1-4, Apr. 1, 1997.

* cited by examiner

*Primary Examiner*—Michelle Estrada

(57) ABSTRACT

The present invention provides a method of depositing epitaxial layers based on Group IV elements on a silicon substrate by Chemical Vapor Deposition, wherein nitrogen or one of the noble gases is used as a carrier gas, and the invention further provides a Chemical Vapor Deposition apparatus (10) comprising a chamber (12) having a gas input port (14) and a gas output port (16), and means (18) for mounting a silicon substrate within the chamber (12), said apparatus further including a gas source connected to the input port and arranged to provide nitrogen or a noble gas as a carrier gas.

5 Claims, 2 Drawing Sheets

METHOD AND APPARATUS FOR FORMING EXPITAXIAL LAYERS

The present invention relates to a method of manufacturing a semiconductor device comprising the step of forming an epitaxial layer on a silicon substrate in particular by means of Chemical Vapor Deposition (CVD), and to an apparatus therefor.

In order to extend the material variety for devices employing silicon microelectronic technology, materials such as $Si_{1-x-y}Ge_xC_y$ (and $Si_{1-y}C_y$) crystals epitaxially grown on Si substrates have generated much interest.

Silicon: Carbon ($Si_{1-y}C_y$) is a new material discussed in, for example, J. P. Liu and H. J. Osten, "Substitutional carbon incorporation during Si1-x-yGexCy growth on Si(100) by molecular-beam epitaxy: Dependence on germanium and carbon" Applied Physics Letters, Vol. 76, No. 24, (2000), P. 3546-48 and H. J. Osten, "MBE growth and properties of supersaturated, carbon-containing silicon/germanium alloys on Si(100)", Thin Solid Films, Vol. 367, (2000), P. 101-111, and it has the same diamond structure as silicon. Typically, the C concentration is between 0 and 5%, i.e. well beyond the solubility limit of C in Si. In $Si_{1-y}C_y$, all carbon atoms should be substitutional, and take the place of a silicon atom in the silicon structure. Therefore a particular challenge for the elaboration of this material is to introduce substitutional carbon into silicon. As noted, the equilibrium solid solubility of C atoms in Si and Ge is extremely small, therefore, it can be desirous to grow high quality $Si_{1-x-y}Ge_xC_y$ crystals with a substitutional C concentration up to a few at %. The fraction of substitutional carbon increases at low temperature. If the carbon atoms are not in a lattice position, that is if they are not substitutional, they can lead to a variety of defects such as, but not limited to, SiC precipitates. Such defects are not suitable for semiconductor applications and epitaxial growth.

It has been shown that $Si_{1-x-y}Ge_xC_y$ and $Si_{1-y}C_y$ epitaxial layers can be grown on a Si(001) substrate using various techniques such as Molecular Beam Epitaxy (MBE), Rapid Thermal Chemical Vapor Deposition (RT-CVD), Low Pressure Chemical Vapor Deposition (LP-CVD) and Ultra High Vacuum Chemical Vapor Deposition (UHV-CVD). The latter being known from B. Tillack, B. Heinemann, D. Knoll "Atomic layer doping of SiGe—fundamentals and device applications", Thin Solid Films, Vol. 369, (2000), p. 189-194; Y. Kanzawa, K. Nozawa, T. Saitoh and M. Kubo, "Dependence of substitutional C incorporation on Ge content for Si1-x-yGexCy crystals grown by ultrahigh vacuum chemical vapor deposition", Applied Physics Letters, Vol. 77, No. 24, (2000), P. 3962-64 and S. John. E. J. Quinomes, B. Ferguson, S. K. Ray, B. Anantharan, S. Middlebrooks, C. B. Mullins, J. Ekerdt, J. Rawlings and S. K. Banerjee, "Properties of Si1-x-yGexCy epitaxial films grown by Ultrahigh Vacuum Chemical Vapor Deposition", Journal of The Electrochemical Society, Vol. 146, No. 12 (1999), P. 4611-4618. One particularly important factor is the relationship between substitutional and interstitial carbon incorporation, which has an impact on the electrical and optical properties of the layer. It is thought that the carbon substitutionality, i.e. the fraction of substitutional incorporated carbon atoms, and the crystal quality, are strongly influenced by growth conditions.

At low temperatures, that is generally below 600° C., the growth rate of epitaxial layers is controlled by the presence of hydrogen atoms on the surface, which results from the decomposition of molecule gases such as $SiH_4$, $Si_2H_6$, $SiH_2Cl_2$, $GeH_4$, $H_2$ during the deposition process, and whose desorption process is not immediate. The equilibrium hydrogen coverage on silicon as a function of the hydrogen pressure and temperature can be modeled by the Langmuir model adsorption as discussed in P. V. Schwartz and J. C. Sturm, "Oxygen incorporation during low temperature chemical vapor deposition growth of epitaxial silicon films", Journal of the Electrochemical Society, Vol. 141, No. 5, (1994), P. 1284-1290. For the growth of epitaxial layers, however, hydrogen is very much dominant as the current carrier gas of choice.

It should be appreciated, and is discussed below, that hydrogen plays a crucial role in epitaxy. All CVD processes use hydrogen as the carrier gas for reasons such as those mentioned above.

It is noted that when Si is grown by CVD from a gas precursor such as $SiH_4$ at low temperature, hydrogen passivates the surface, rendering it inert to contaminants that would prevent epitaxy. Furthermore, it is believed that hydrogen may be beneficial for epitaxy by contributing to interface abruptness for hetero-layers and by reducing surface absorption and diffusion during growth. Analogous behavior has also been found when a variety of dopants are absorbed on the growth front. This also explains why as known from E. Finkman, F. Meyer and M. Mamor, "Short-range order and strain in SiGeC alloys probed by phonons", Journal of Applied Physics, Vol. 89, No. 5 (2001), p. 2580-2587, attempts are being made to employ hydrogen in the Molecular Beam Epitaxy (MBE) technique where no carrier gas is in fact required.

Further, the effect of germane on hydrogen desorption is known from M. Liehr, C. M. Greenlief, S. R. Kasi and M. Offenberg, "Kinetics of silicon epitaxy using SiH4 in a rapid thermal chemical vapor deposition reactor", Applied Physics Letters, Vol. 56, No. 7, (1990), P. 629-631. The results discussed are widely used in the SiGe growth models and report that germane has an enormous catalytic effect on the growth rate of silicon at low temperature. This catalytic effect increases the hydrogen desorption from germanium sites on the growth surface, allowing increased adsorption of the growth species and hence an enhanced growth rate. This document concludes that in low-temperature vapor phase epitaxy, a small addition of germane can increase the effective growth rate of silicon by two orders of magnitude. Although the exact mechanism responsible for the catalysis is not known, this effect is very favorable because it enables growth rates to be obtained for the $Ge_xSi_{1-x}$ films (100 Å/min) at low temperatures without the use of lasers, plasmas, or other exotic growth enhancement techniques.

It is also known that hydrogen works as a surfactant in SiGe epitaxy, suppressing three-dimensional growth which can lead to roughness or island formation of SiGe as discussed in J. Vizoso, F. Martin, J. Sune and M. Nafria, "Hydrogen desorption in SiGe films: A diffusion limited process", Applied Physics Letters, Vol. 70, No. 24, (1997), p. 3287-89.

Thus, for good reason hydrogen has been considered the carrier gas of choice and is, in general, an important gas for use in the epitaxial process.

WO-A-01/14619 discloses the epitaxial growth of silicon carbide and/or silicon germanium carbide, and employs nitrogen as a carrier gas. However, the epitaxial reactor disclosed in this document is arranged to operate at ultra high temperatures, i.e. in the range of 1100-1400° C.

The present invention seeks to provide a method of forming epitaxial layers on a silicon substrate by means of CVD, which method also offers advantages over known such methods.

The invention also seeks to provide such a Chemical Vapor Deposition apparatus.

According to one aspect of the present invention there is provided a method of manufacturing a semiconductor device comprising the step of depositing an epitaxial layer based on Group IV elements on a silicon substrate by Chemical Vapor Deposition, and comprising employing nitrogen or one of the noble gases as a carrier gas.

In particular, such carrier gases advantageously serve to control the quality of the epi-layers and the carbon incorporation.

In particular, through using nitrogen as a carrier gas it has become possible to obtain smooth epitaxial silicon layers at higher growth rates and lower growth temperatures as compared with known Si epitaxy processes employing hydrogen as a carrier gas.

The features of some of the claims confirm the particular Group IV elements that can form part of an epitaxial system according to the present invention.

The features of some of the claims advantageously further improve the deposition rate and can serve to limit the cost of production.

Through the use of nitrogen as a carrier gas for low temperature CVD epitaxy of Silicon, Silicon: Carbon, Silicon Germanium and Silicon Germanium Carbon, it has become possible to increase the process windows considerably beyond the limits which are inherent in processes employing hydrogen as the carrier gas. The low temperature epitaxy process with nitrogen as the carrier gas has a different growth mechanism compared to the low temperature epitaxy process with hydrogen as the carrier gas. This leads to higher quality materials and improved carbon incorporation.

The invention can be employed in particular for depositing doped or undoped $Si_{1-x-y}Ge_xC_y$ and $Si_{1-y}C_y$ epitaxial layers on Si substrates at high growth rates, high carbon substitutionality, and low cost of production. The combination of low growth temperature and high growth rates is also attractive for applications requiring low thermal budget such as Si cap layers on top of a strained SiGe layer with a high Ge concentration.

The invention is described further hereinafter, by way of example only, with reference to the accompanying drawings in which.

Experiments were conducted with a commercial reduced pressure chemical vapor deposition reactor, and the following relates to the basic effects on the SiGe growth.

Figure 1:
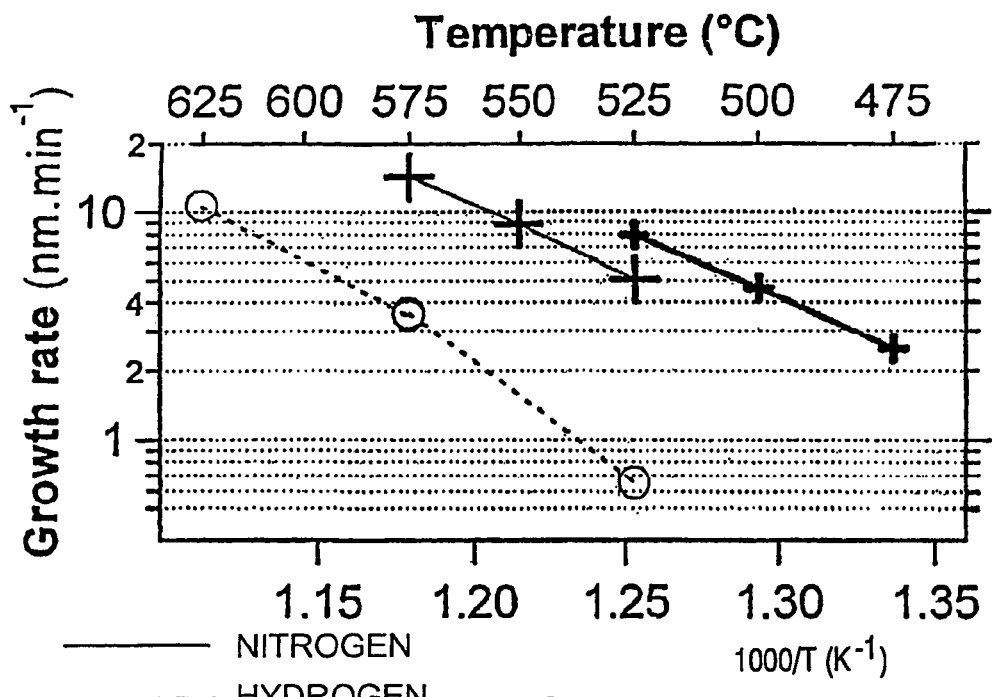
FIG. 1 is a graphical illustration of the temperature dependence of the growth rate, with nitrogen being used as the carrier gas instead of hydrogen.

The growth rate of SiGe as a function of temperature using hydrogen and nitrogen as a carrier gas is shown in FIG. 1. The growth conditions for nitrogen were Pressure=40 Torr, $N_2$=33 slm, $SiH_4$=5 sccm, $GeH_4$=150 sccm. For the hydrogen trace the pressure was 40 Torr, $H_2$=33 slm, $SiH_4$=20 sccm and $GeH_4$=150 sccm.

This clearly shows that the growth rate of SiGe using nitrogen as the carrier gas can be increased by a factor of 10 at a low temperature compared to the growth rate of SiGe with hydrogen as the carrier gas. A similar effect has also been observed when growing only silicon, in which case the growth rate is multiplied by a factor of 6 (at 575° C. and with a silane flow of 400 sccm) when the carrier gas is switched from hydrogen to nitrogen.

The same general growth conditions, i.e. carrier gas flow, growth temperature and total pressure etc. have been employed in order to highlight the effect of the carrier gas species on the growth rate. It is of course noted that in practice this would lead to a very poor uniformity of the SiGe thickness and Ge concentration of the epi-layers over the wafer in the range of 15%, which would be unacceptable for practical applications.

Figure 2:
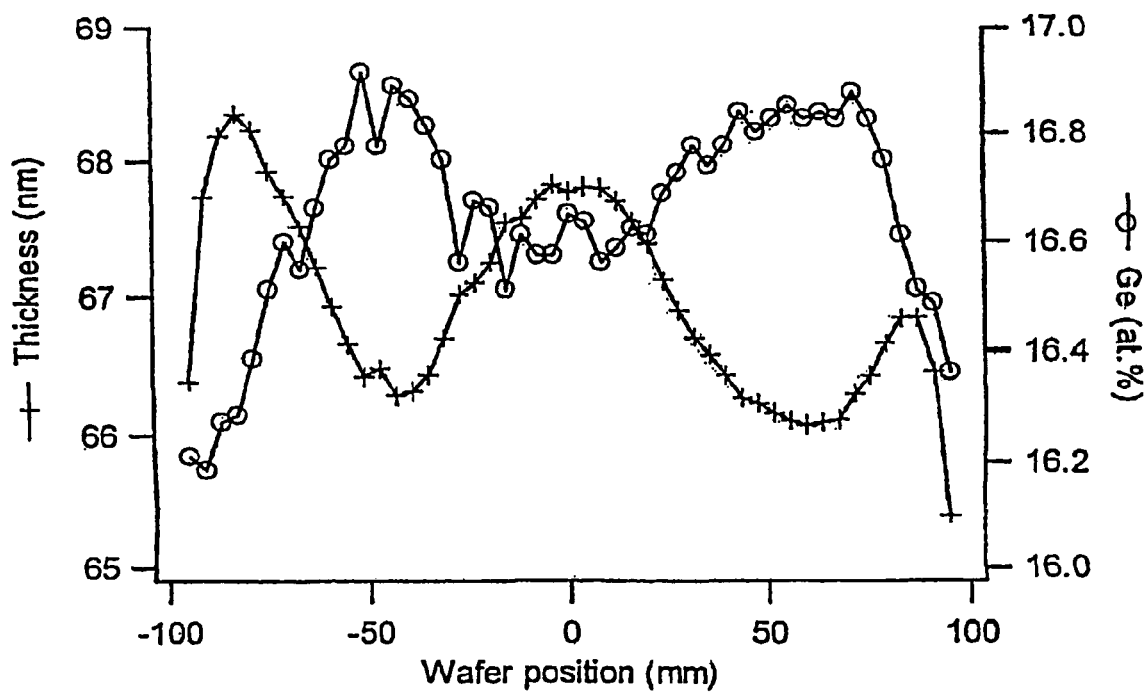
FIG. 2 is a graphic representation of the thickness and the germanium concentration uniformity over the wafer.

In the semiconductor industry the uniformity of the thickness and the constituents concentration of the epitaxial layers is of prime importance. In this respect the design of the reactor and especially the direction and magnitude of the gas flow with respect to the position of the wafers is a decisive factor. As illustrated in FIG. 2, smooth uniform SiGe(C) epi-layers can be grown with nitrogen as the carrier gas and through adjustment of different growth parameters.

Figure 3:
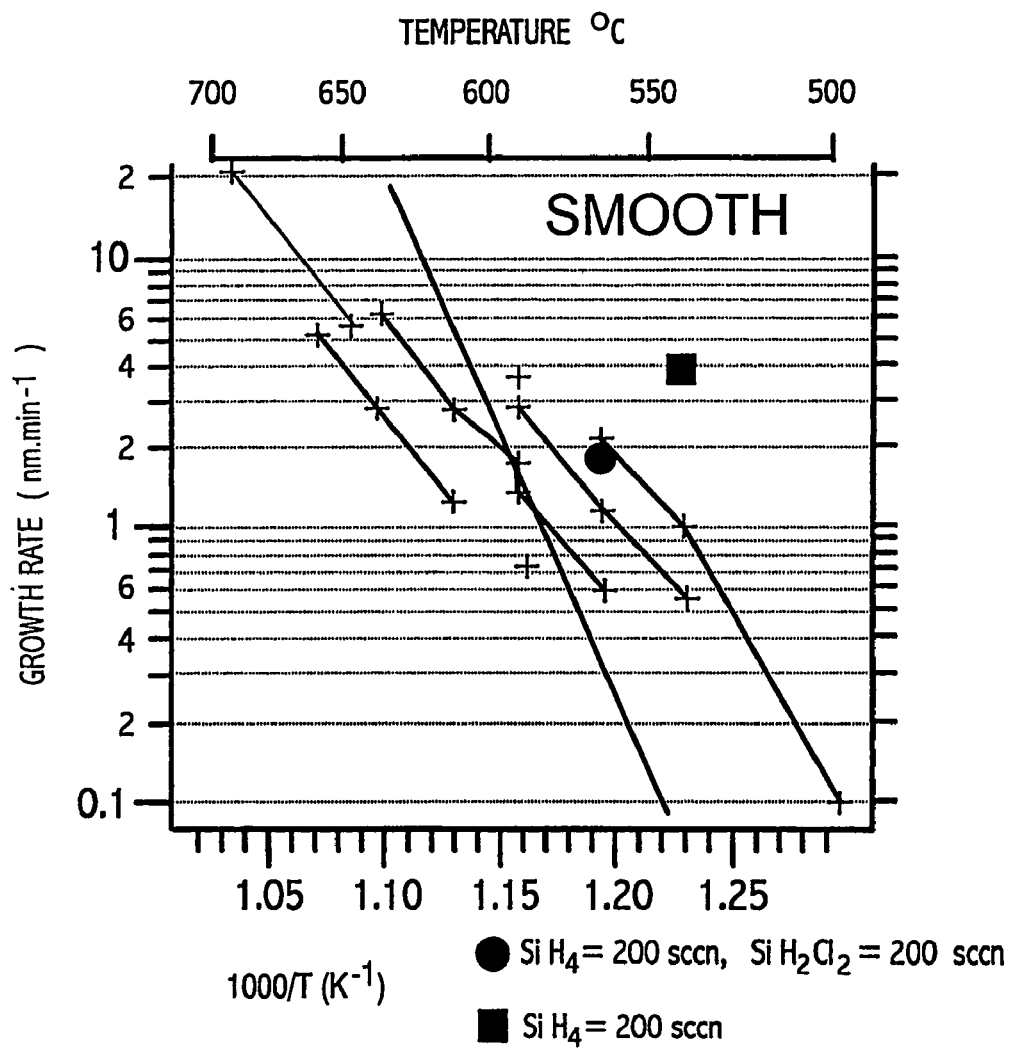
FIG. 3 is a further graphic representation illustrating the benefits of employing nitrogen as a carrier gas.

FIG. 3 provides a further illustration of the advantages of employing nitrogen as a carrier gas as compared with hydrogen. FIG. 3 in particular illustrates the advantages achieved with low temperature silicon epitaxy, and for the grown condition of P=40 Torr and $N_2$=15 slm as illustrated, smooth epitaxial silicon layers can be achieved at relatively high growth rates and at lower growth temperatures. Higher quality materials, with improved carbon incorporation, can therefore be produced.

Figure 4:
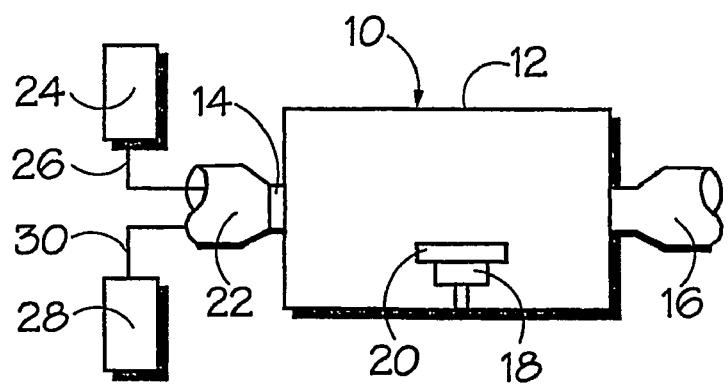
FIG. 4 is a schematic block diagram illustrating a chemical vapor phase deposition apparatus for use in accordance with the present invention.

Turning now to FIG. 4, there is illustrated chemical vapor deposition apparatus 10 arranged for use in accordance with the present invention and comprising an elongate chamber 12 having at one end a gas input port 14 and at an opposite end a gas output port 16. The chamber 12 houses a pedestal mount 18 upon which is located a silicon substrate 20.

The pressure within the chamber 12 can be controlled by means of the manner in which gas is introduced therein via the input port 14 and extracted therefrom via the output port 16. The input port 14 is in communication with a gas manifold 22 into which are fed gases from a plurality of sources. In the illustrated example, a first source 24 is illustrated for feeding a first gas by way of the feed line 26 to the gas manifold 22, and a second gas source 28, which in this illustrated example is arranged for feeding the gas by way of a feed line 30 into the gas manifold 22.

The total number of gas sources can of course be arranged as required with regard to the epitaxial layer to be formed on the substrate 20.

Tests have been conducted at a growth temperature of 575° C. At this temperature, the growth rate seems to be mass transport controlled or diffusion limited controlled, depending on the silane flow, and growth rates around 10 nm/min with a small density of defects have been obtained. The combination of $SiH_4$ and $SiH_2Cl_2$ gases as Si precursor gases may be an alternative depending on the growth temperature. For temperatures lower than 550° C., the hydrogen atoms created at the surface as a by-product of the growth are considered to passivate the Si surface.

It is known that the low carbon solid solubility in Si makes the carbon incorporation in silicon a critical process.

It has proved possible to grow high quality silicon carbon epitaxial layers at a growth temperature of 550° C. using silane and nitrogen as a carrier gas.

Smooth and high quality materials can be grown according to the present invention. The growth conditions for nitrogen were P=40 Torr, $N_2$=33 slm, $SiH_4$=5 sccm, $GeH_4$=150 sccm; for hydrogen, the conditions were P=20 to 40 Torr, $H_2$=33 slm, $SiH_4$=20 sccm and $GeH_4$=150 sccm.

As will therefore be appreciated, through the use of nitrogen as a carrier gas high quality smooth silicon germanium carbon epitaxial layers were grown with, for example, a germanium concentration in the order of 20 at. % and a carbon concentration up to 1.3%. The growth conditions for such an example included a deposition temperature of 525° C., a nitrogen flow of 15 slm, a silane (SiH$_4$) flow of 20 sccm, a germane (GeH$_4$) flow of 150 sccm and a methyl-silane (SiH$_3$CH$_3$) flow between 0 and 20 sccm; and the results clearly illustrate the benefit of the process of the present invention when employing nitrogen as a carrier gas. Of course the substitutional carbon concentration can be increased by lowering the growth temperature and by increasing the Mano-Methyl-Silane flow.

The invention describes a method of depositing epitaxial layers based on the Group IV elements Si, Ge, C on a Si substrate in a commercial CVD reactor and, as noted, advantageously employs nitrogen, or a noble gas, as a carrier gas in order to grow high quality epitaxial materials with high substitutional carbon content and at a lower cost of production compared to currently standard processes using hydrogen as the carrier gas.

The invention claimed is:

1. A method of manufacturing a semiconductor device comprising the step of depositing an epitaxial layer based on Group IV elements on a silicon substrate by Chemical Vapor Deposition using source gases, and including employing nitrogen as a carrier gas, wherein the epitaxial layer comprises $Si_{1-x-y}Ge_xC_y$.

2. The method as claimed in claim 1, which is carried out at a temperature that facilitates a CVD growth rate of an epitaxial layer that is substantially greater than a CVD growth rate of such an epitaxial layer using hydrogen as a carrier gas.

3. A method as claimed in claim 1, which is carried out at a temperature of less than about 600° C.

4. A method as claimed in claim 1, which is carried out at a temperature between 500° C. and 600° C.

5. A method claimed in claim 1, wherein the source gases include SiH$_4$, GeH$_4$ and SiH$_3$CH$_3$.

* * * * *